(12) United States Patent
Godet et al.

(10) Patent No.: US 8,354,655 B2
(45) Date of Patent: Jan. 15, 2013

(54) METHOD AND SYSTEM FOR CONTROLLING CRITICAL DIMENSION AND ROUGHNESS IN RESIST FEATURES

(75) Inventors: Ludovic Godet, Boston, MA (US); Christopher J. Leavitt, Gloucester, MA (US); Joseph C. Olson, Beverly, MA (US); Patrick M. Martin, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 13 days.

(21) Appl. No.: 13/099,432

(22) Filed: May 3, 2011

(65) Prior Publication Data

US 2012/0280140 A1 Nov. 8, 2012

(51) Int. Cl.
*H01J 37/32* (2006.01)
(52) U.S. Cl. .................... 250/492.23; 250/492.3
(58) Field of Classification Search .......... 250/492.23, 250/493.3, 492.1, 492.21, 492.3; 430/325; 438/798, 513; 118/723 R
See application file for complete search history.

(56) References Cited

U.S. PATENT DOCUMENTS

| | | | | |
|---|---|---|---|---|
| 6,127,098 | A * | 10/2000 | Nakagawa et al. | 430/315 |
| 7,767,977 | B1 * | 8/2010 | Godet et al. | 250/423 R |
| 8,087,379 | B2 * | 1/2012 | Chandler et al. | 118/723 FI |
| 2006/0045987 | A1 * | 3/2006 | Chandler et al. | 427/569 |
| 2008/0182419 | A1 | 7/2008 | Yasui et al. | |
| 2009/0014667 | A1 * | 1/2009 | Hahto et al. | 250/492.21 |
| 2010/0255683 | A1 | 10/2010 | Godet et al. | |
| 2011/0223546 | A1 * | 9/2011 | Godet et al. | 430/325 |
| 2012/0082942 | A1 | 4/2012 | Godet et al. | |

OTHER PUBLICATIONS

Kuo, Y. "Plasma Swelling of Photoresist" Jpn. J. Appl. Phys. vol. 32 (1993) pp. 126-128.*
Kuo, Y., Plasma Swelling of Photoresist, Japanese Journal of Applied Physics, Jan. 15, 1993, pp. L126-L128, vol. 32, No. 1A/B, Part 2, Japan Society of Applied Physics, Tokyo, Japan.
Method for the Fabrication of a Micro-Lithography Mask Incorporating Phase Shifting and Light Absorption Regions, IBM Technical Disclosure Bulletin, May 1, 1993, pp. 51-53, vol. 36, No. 5, International Business Machines, Corp., United States.

* cited by examiner

*Primary Examiner* — Robert Kim
*Assistant Examiner* — Wyatt Stoffa

(57) ABSTRACT

A method of treating a photoresist relief feature having an initial line roughness and an initial critical dimension. The method may include directing ions toward the photoresist in a first exposure at a first angular range and first dose rate and a that is configured to reduce the initial line roughness to a second line roughness. The method may also include directing ions toward the photoresist relief feature in a second exposure at a second ion dose rate greater than the first dose rate, wherein the second ion dose rate is configured to swell the photoresist relief feature.

15 Claims, 5 Drawing Sheets

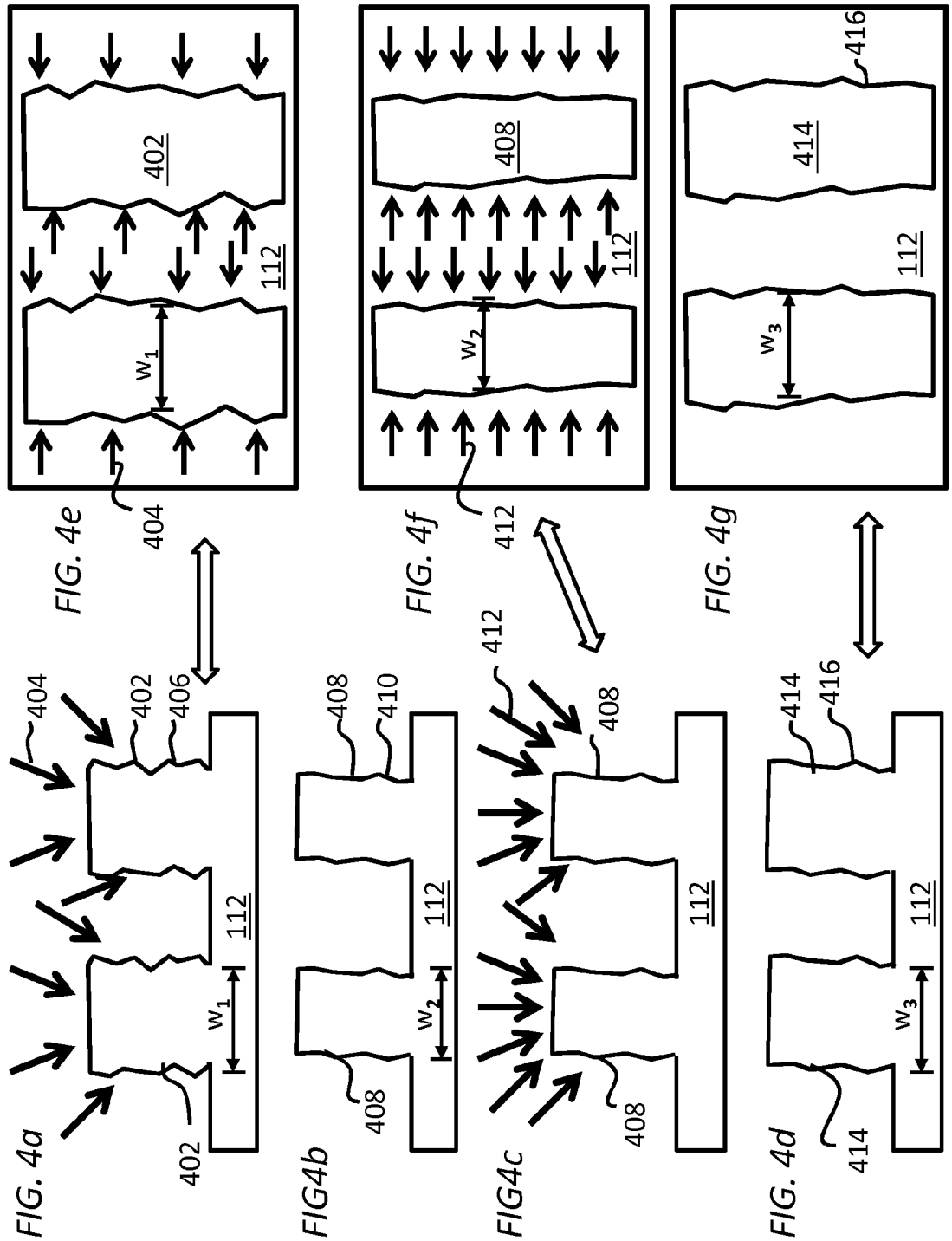

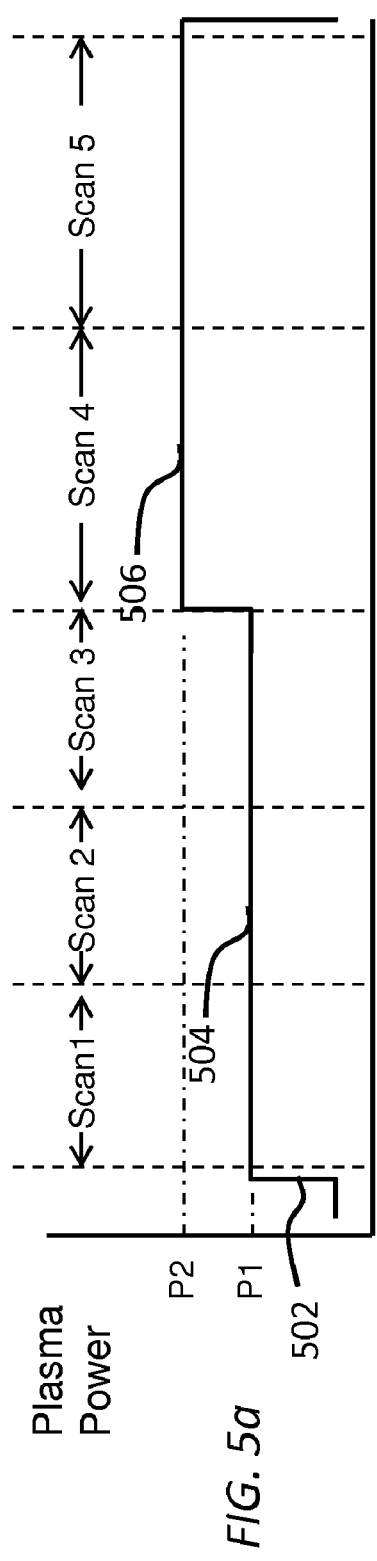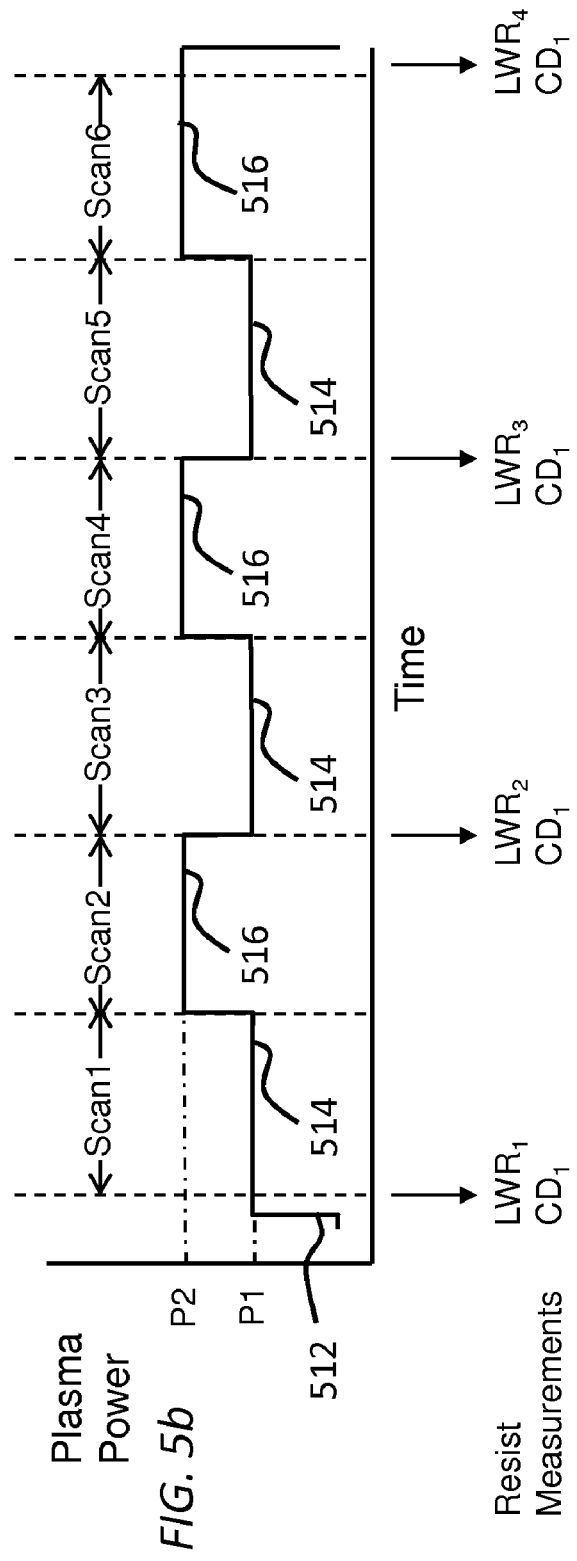
FIG. 5a
FIG. 5b

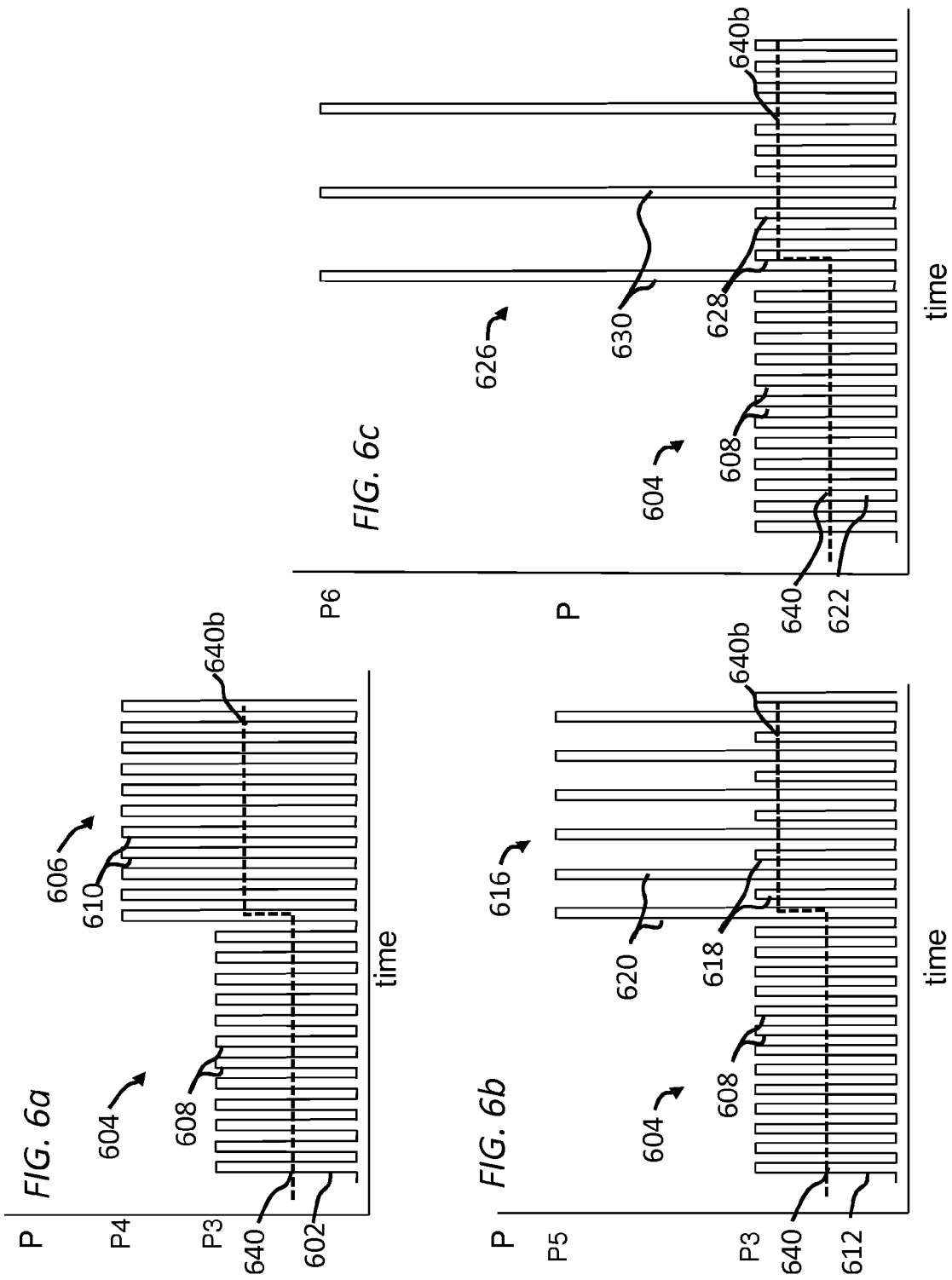

METHOD AND SYSTEM FOR CONTROLLING CRITICAL DIMENSION AND ROUGHNESS IN RESIST FEATURES

BACKGROUND OF THE INVENTION

1. Field of the Invention

Embodiments of the invention relate to the field of device manufacturing. More particularly, the present invention relates to a method, system and structure for controlling roughness and critical dimension in patterned resist features.

2. Discussion of Related Art

Optical lithography is often used in manufacturing electronic devices. It is a process by which a substrate is patterned so that circuits may be formed on the substrate according to the pattern. Referring to FIGS. 1a-1e, there are shown simplified illustrations of an optical lithographic process. Generally, the substrate 112 is coated with photo-curable, polymeric photoresist 114 as shown in FIG. 1a. Thereafter, a mask 142 having a desired aperture pattern is disposed between the substrate 112 and a light source (not shown). The light 10 from the light source is illuminated onto the substrate 112 via the aperture of the mask 142, and the light transmitted through the mask's aperture (or the image of the pattern) is projected onto the photoresist 114. A portion of the photoresist 114a is exposed to the light 10 and cured, whereas the rest of the photoresist 114b remains uncured as illustrated in FIG. 1b. As a result, an image of the mask's aperture is formed by the cured portion of the photoresist 114a.

As illustrated in FIG. 1c, the uncured portion of the photoresist 114b is stripped, and a three dimensional (3D) photoresist relief feature 114a corresponding to the mask's aperture pattern may remain on the substrate 112. Thereafter, the substrate is etched, and trenches 116 corresponding to the negative image of the mask's aperture pattern may form (FIG. 1d). After the remaining photoresist 114b is removed, a patterned substrate 112 is formed as illustrated in FIG. 1e. If a metallic layer is deposited on the trenches, a circuit having a desired pattern may be formed on the substrate 112.

Although optical lithography is an efficient process with high throughput, the process is not without disadvantages. One disadvantage may include line width roughness (LWR) or line edge roughness (LER). As known in the art, LWR is excessive variations in the width of the photoresist relief feature formed after uncured portions of the photoresist 114b is stripped from the substrate. If the variations occur on the side surface of the photoresist relief or feature the variation is known as LER. The roughness or variations due to LWR or LER may be disadvantageous as the variation may be transferred onto the trenches during etch and ultimately to the circuit. The variations become more significant with a decrease in feature size of the photoresist relief or trenches. For 32 nm devices variations of 4 nm or larger have been observed. Because the geometrical shape of a patterned resist feature, including line roughness effects such as LWR and LER, is transferred from a resist layer to an underlying permanent layer of a device during patterning of the underlying layer, LWR and LER can limit the ability to form devices of acceptable quality for dimensions below about 100 nm. Such variations may lead to non-uniform circuits and ultimately device degradation or failure. In addition, depending on design criteria, device performance may be impacted more by either one of short, medium, or long range roughness.

Several approaches have been attempted to address LWR and LER effects (the combination of either LWR, LER or both LWR and LER may be referred to collectively hereinafter as "line roughness"). One technique that shows promise for reducing line roughness is ion beam smoothening in which ions are directed over a range of angles towards patterned photoresist relief features. This technique has met with success in modifying line roughness in narrow photoresist relief features in which the critical dimension is less than about 100 nm. In a typical ion beam smoothening process using ions directed over a range of angles on the patterned photoresist, the LWR/LER can be reduced up to about 50%. However, the critical dimension (CD) may also decrease by up to about 10 nm after an ion beam smoothening process is performed, which may represent an unacceptably large decrease depending on desired device characteristics.

Increasing the power of a plasma source used during an ion beam smoothening process has been observed to lessen or eliminate the reduction in CD, but the increased power has also been observed to be less effective in reducing line roughness [For instance, performing an ion beam smoothening process at 300 W may result in a ~25% reduction in LWR, but may also yield a ~20% reduction in CD. At 500 W power, the loss of CD may be close to zero, however, the reduction in LWR may be only about 15%, which may not meet designer specifications.] Thus, the present day ion beam smoothening process presents a tradeoff between improved roughness versus loss of critical dimension. In view of the foregoing, it will be appreciated that there is a need to improve photoresist processing techniques for technologies requiring very small feature sizes, such as sub-100 nm CD devices.

SUMMARY OF THE INVENTION

Embodiments of the present invention are directed to methods and systems for improving patterning a substrate, in particular, by improving roughness and controlling critical dimension in photoresist relief features used to pattern an underlying substrate. In one embodiment, a method of treating a photoresist relief feature having an initial line roughness and an initial critical dimension includes directing ions toward the photoresist in a first exposure at a first angular range and first dose rate that is configured to reduce the initial line roughness to a second line roughness. The method further includes directing ions toward the photoresist relief feature in a second exposure at a second ion dose rate greater than the first dose rate, the second ion dose rate being configured to swell the photoresist relief feature.

In another embodiment, a system for treating a photoresist relief feature disposed on a substrate includes a plasma source configured to generate a plasma having a plasma sheath and an extraction plate disposed between the plasma and substrate and configured to direct ions over an angular range toward the substrate. The system further includes a controller operable to vary exposure conditions of the substrate to the plasma, wherein in a first exposure ions are directed toward the photoresist at a first ion dose rate and a first angular range wherein in a second exposure, ions are directed toward the photoresist at a second ion dose rate greater than the first dose rate. The first exposure may be configured to reduce the initial line roughness to a second line edge roughness, and the second exposure configured to swell the photoresist relief feature, wherein, after the first and second exposures, a third edge roughness of the photoresist relief feature is less than the first line roughness and a third critical dimension is greater than the second critical dimension.

BRIEF DESCRIPTION OF THE DRAWINGS

FIGS. 4a-4d and 4e-4g depict side cross-sectional and top plan views of patterned photoresist relief features that depict an exemplary process for treating photoresist relief features.

FIG. 5a depicts an exemplary plasma power curve.

FIG. 5b depicts another exemplary plasma power curve.

FIGS. 6a-6c depict alternate embodiments of pulsed plasma processing in which the average ion dose rate is varied between relatively lower and higher values.

DESCRIPTION OF EMBODIMENTS

Figure 1A:
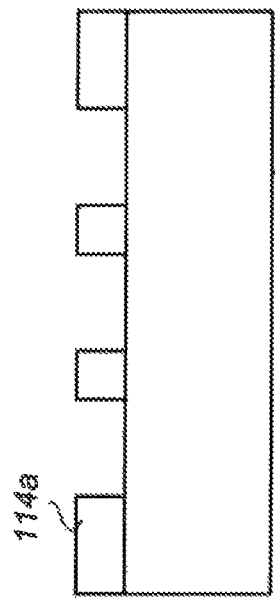
FIGS. 1a-1e are schematic cross-sections of a substrate that illustrate steps of a conventional optical lithographic process.
Figure 1B:
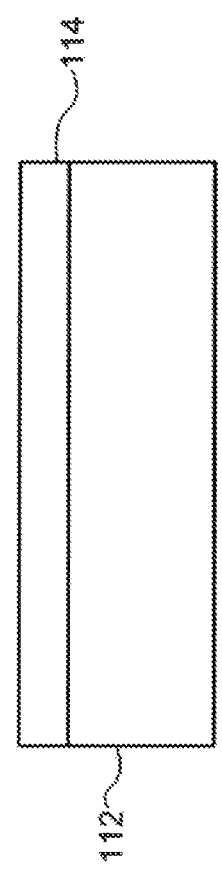
Figure 1C:
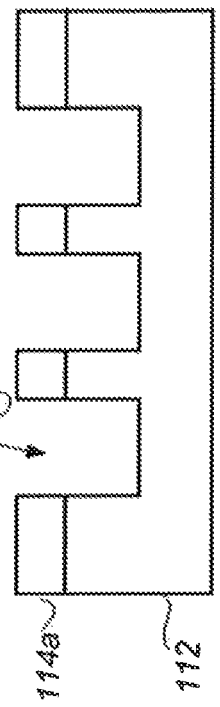
Figure 1D:
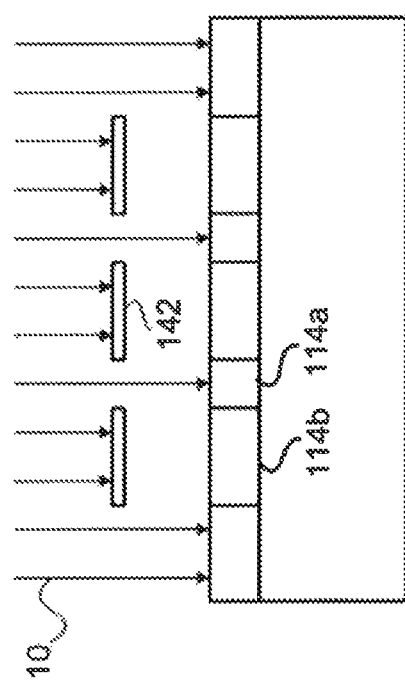
Figure 1E:
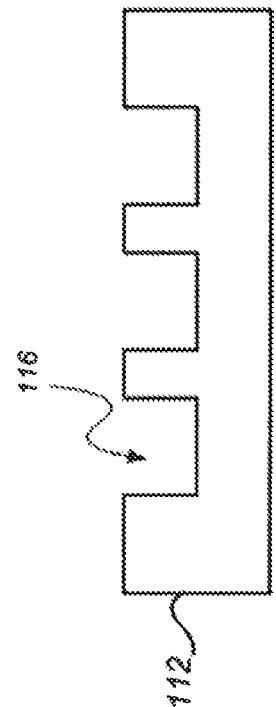

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In particular, the present disclosure focuses on techniques relating to ion implantation processes for improving the quality of photoresist relief features such as improving line roughness and controlling CD in photoresist relief features. The processes disclosed herein may be used in conjunction with processes for forming narrow features, including features that are incorporated into arrays having very small pitch, for example a pitch less than about 250 nm. Such processes include conventional DUV lithography, double patterning lithography, self aligned double patterning lithography, and other lithographic processes. However, those of ordinary skill in the art will recognize that the techniques disclosed herein are not limited to use in conjunction with any particular lithography or any range of photoresist relief feature dimensions.

Figure 2A:
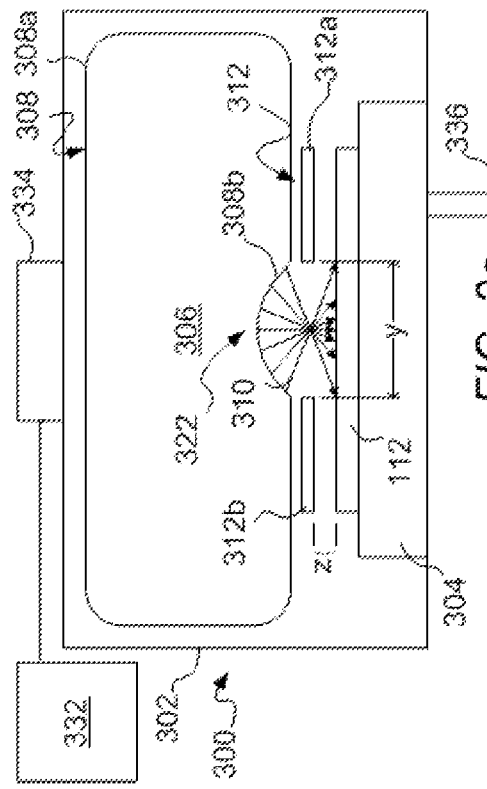
FIG. 2a is a schematic depiction of a substrate processing system, in accordance with one embodiment of the present invention.
Figure 2B:
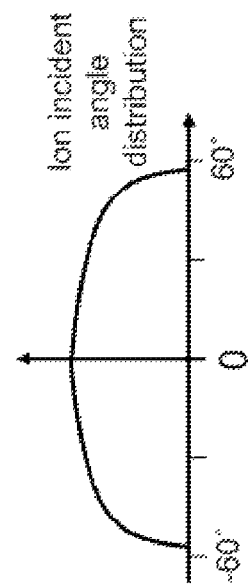
FIG. 2b illustrates an exemplary angular distribution of incident particles on a substrate, as provided by embodiments of the present invention.

Some embodiments of the disclosure employ plasma-based ion implantation processes to treat resist features having very small dimensions. Referring to FIG. 2a, there is shown a substrate processing system 300 for processing photoresist relief features according to one embodiment of the present invention. FIG. 2b illustrates one example of angular distribution of the particles treating the photoresist. The figures are not necessarily drawn to scale.

As illustrated in FIG. 2a, the system 300 may include a process chamber 302 in which a substrate holder 304 is configured to support substrate 112. The substrate 112 may be a metallic, semiconducting, or insulating material based substrate. In some embodiments, the substrate holder may be provided with active cooling using cooling lines 336 coupled to a cooling source, such as a fluid source (not shown). A patterned photoresist (not shown in FIG. 2a) is disposed on the substrate which may be a cured portion of the photoresist remaining on the substrate after the uncured portion is stripped.

The system 300 may also include a plasma source for generating a plasma 306 contained in the process chamber 302. In various embodiments, the plasma source may be an in situ or remote, a DC or RF plasma source, an inductively coupled plasma source, capacitively coupled plasma source, helicon source, microwave source, or any other type of plasma source.

As depicted in FIG. 2a, in some embodiments that employ an RF plasma source, an RF power supply 330 provides an RF signal that can drive antenna 332 to generate plasma 306. The RF power supply 330 may vary the amplitude of a generated signal supplied to antenna 332 and thereby change the plasma power within plasma 306. As described below, this may be used to control ion dose rate directed toward substrate 112.

Between the plasma 306 and the substrate 112, one or more plasma sheath modifiers 312 may be disposed. In the present embodiment, the plasma sheath modifier 312 may comprise a pair of modifier parts 312a and 312b spaced apart from one another by a gap "y." In another embodiment, the plasma sheath modifier 312 may comprise a single modifier part. Yet in other embodiments, the plasma sheath modifier 312 may comprise three or more modifier parts spaced apart from one another defining the gap.

The plasma sheath modifier 312 is capable of adjusting the electric field of the plasma sheath. In some embodiments, the plasma sheath modifier 312 may be positively or negatively charged. The plasma sheath modifier 312 may be made from electrically insulating (e.g. glass) or conducting (e.g. metallic) material, or a combination thereof. If the system 300 includes more than one modifier parts, the parts may be made from the same or different material. For example, the system 300 may include a plasma sheath modifier 312, and the plasma sheath modifier 312 may comprise two modifier parts 312a and 312b. The modifier parts 312a and 312b may be made from the same or different material.

If the plasma sheath modifier 312 comprises two or more parts, the parts may be disposed on the same plane or different planes. For example, the plasma sheath modifier 312 included in the processing system 300 may comprise two modifier parts 312a and 312b. The parts 312a and 312b may be disposed in the same plane such that the vertical spacings "z" between the substrate 112 and each modifier part are the same. In another embodiment, the plasma sheath modifier 312 may comprise two modifier parts 312a and 312b, and each part 312a and 312b may be spaced apart from the substrate 112 by different vertical spacings "z." Additional description of the processing system with the plasma sheath modifier can be found in co-pending U.S. patent application Ser. Nos. 12/418,120; 12/417,929, filed Apr. 3, 2009, and issued as U.S. Pat. No. 7,767,977; and Ser. No. 12/644,103, each of which is herein incorporated in its entirety by reference.

In operation, plasma generated in situ or remotely may be contained in the process chamber 302. The plasma 306 may contain fragments including electrons, proton, and atomic or molecular ions, neutrals, and radicals of desired species. As illustrated in FIG. 3a, the plasma 306 may also include plasma sheath 308 near the periphery. In the present embodiment, the plasma sheath 308 may comprise positively charged ions. As depicted in the Figures, plasma sheath 308 is represented by a boundary of the sheath with plasma 306. However, it will be understood that plasma sheath 308 may extend a finite distance from an edge of plasma 306 to surfaces of objects around plasma 306, for example, the walls of process chamber 302, and the surface of substrate 112.

The ions 310 in the plasma sheath 308 or the plasma 306 may be directed toward the substrate 112, as the substrate 112 is biased by a DC or RF bias supply (not shown). The bias signal applied to the substrate 112, whether DC or RF, may be continuous or pulsed.

The plasma sheath modifier 312 may modify the shape of the plasma sheath 308 so as to control the distribution of incident angles of the ions 310. For example, the plasma sheath modifier 312 may modify the electric field in the plasma sheath 242 and modify the shape of the plasma sheath 308. In the present embodiment, the plasma sheath modifier 312 may modify at least a portion of the plasma sheath 308 into a concave shaped plasma sheath 308b (modified sheath 308b) relative to the plasma 306, or a dome shaped (convex) plasma relative to the bulk plasma. When the substrate 112 is biased, the ions 310 attracted toward the substrate 112 may travel through the gap 322 of width "y" between the modifier parts 312a and 312b at a large range of incident angles. In the conventional plasma based processing systems, the plasma sheath closest to the substrate lies parallel to the substrate. When the substrate is biased, the ions travel in a path substantially perpendicular to the plasma sheath, thus substantially perpendicular to the substrate. As a result, the ions in the conventional plasma processing system have incident angle ranging from −3°−+3°. In the present embodiment, however, the incident angle of the ions 310 may be modified with the modified sheath 308b. As illustrated in FIG. 2a, the modified sheath 308b is multi-angled relative to the substrate. As such, ions 310 traveling perpendicular to the modified sheath 308b may travel in multiple angles. The ions 310 traveling toward the substrate 112 from different portions of the modified sheath 308b may exit the plasma 306 from a large range of different angles, such that the ions 310 therefore have a large range of incident angles on substrate 112. As illustrated in FIG. 2b, the incident angles of the ions 310 may range between about +60° to about −60°, centered about 0° with respect to perpendicular. In some embodiments, the incident angles of the ions 310 may additionally be modified by the electric field generated by the plasma sheath modifier 312, and the range of incident angles of the ions 310 may be adjusted by controlling other system parameters, as discussed below.

Depending on a number of factors including, but not limited to, configurations and properties of the plasma sheath modifier 312, the incident angle of the ions may be additionally modified. Example of such factors may include the horizontal spacing (Y) between the modifier parts 312a and 312b, the vertical spacing (Z) between the modifier 312 and the substrate 112, difference in the vertical spacing (z) between the substrate 112 and each modifier parts 312a and 312b (not shown), and the electrical properties of the plasma sheath modifier 312. Other plasma process parameters may also be adjusted to adjust the ions' incident angle and/or incident angle distribution. Additional description may be found in the co-pending U.S. patent application Ser. Nos. 12/418,120, 12/417,929, 12/644,103, each of which application, as noted above, is incorporated in entirety by reference.

Figure 3:
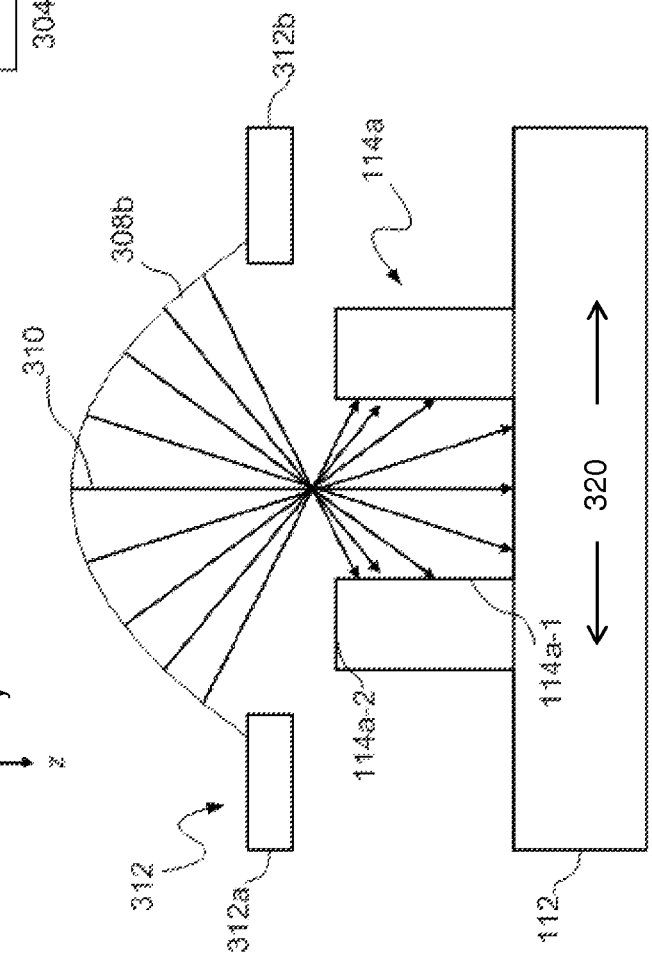
FIG. 3 depicts a schematic cross section of a plasma sheath modifier and a photoresist relief feature that illustrate exemplary features of the invention.

By modifying the plasma sheath 308, a three dimensional structure with surfaces oriented at different angles may be treated conformally or isotropically. Referring to FIG. 3, there is shown a technique for processing 3D structure according to one embodiment of the present disclosure. In the present embodiments, the technique may be used to reduce LER and LWR contained in 3D photoresist relief feature 114a. As noted above, LER and LWR may occur in a 3D photoresist relief feature 114a obtained during optical lithography, after uncured portion of the photoresist is removed. In the present embodiments, LER and LWR contained in the photoresist relief feature 114a may be reduced by exposing the photoresist relief features to ions 310.

As illustrated in FIG. 3, 3D photoresist relief feature 114a having side surface 114a-1 and top surface 114a-2 may be disposed on the substrate 112. The substrate 112 and the photoresist relief feature 114a disposed in the plasma processing system containing the plasma sheath modifier 312, and plasma is disposed near the substrate 112. Thereafter, the ions 310 in the plasma may be directed through the gap between the plasma sheath modifier parts 312a and 312b, toward the surfaces of the photoresist relief feature 114a. As illustrated in the figure, the ions 310 may be directed at multiple incident angles.

In various embodiments, the ions 310 may be implanted into the side and top surfaces 114a-1 and 114a-2 of the photoresist relief feature 114a. Although various ion species may be implanted, helium (He) or argon (Ar) ions may be implanted in some embodiments. Although the duration of exposure of the photoresist to ions may cover a wide range, in some embodiments, the total exposure time may vary from about several tenths of seconds to several minutes.

Experiments were conducted to study the effect on LWR/LER and CD of a plasma processing system (PSM system) arranged in accordance with the present invention. As used hereinafter, the term "PSM system" or "PSM plasma system" refers to a plasma processing system that employs a plasma sheath modifier to provide a wide range of angular distribution of ions toward a substrate positioned adjacent to a portion of the plasma. The term "wide," "wide range," or "wide angular range," as used in conjunction with angle of ion incidence, refers to a set of angles that spans a total range of about 5 degrees or larger. A plasma sheath modifier was used to provide an exposure comprising a dose of ions distributed over a wide angular range, as illustrated in FIG. 2b. The plasma sheath modifier may comprise a plate having one or more apertures that induces formation of a modified plasma sheath (see element 308b) and thereby extracts ions from the plasma such that the ions impinge on a substrate over a wide angular range. In some embodiments, the aperture(s) of a plasma sheath modifier may have a width of about 0.1 mm to 10 mm. In order to expose a large area of a substrate, the substrate may be scannable with respect to the aperture of a plasma sheath modifier so that the size of regions of the substrate exposed to ions is controlled by the scan length.

Referring again to FIG. 3, in a series of separate experiments, a set of photoresist lines having nominal CD of about 40 nm was exposed to a 4 kV Ar plasma using an exemplary extraction plate at a respective series of different plasma power levels. When photoresist lines were exposed to a plasma whose power was 300 W, a reduction in LWR of about 26% was observed, while a reduction in CD of the photoresist lines of about 20% was also found. When the photoresist lines were instead exposed to a plasma at a plasma power level to 500 W, little, if any, reduction in CD was observed. However, the reduction in LWR was only about 11%. Thus, the use of higher plasma power may be effective in avoiding unwanted reduction in CD, but may be less effective in smoothening photoresist relief features.

In order to overcome this tradeoff between reducing LWR and preserving CD, embodiments of the present disclosure employ a novel technique in which photoresist relief features are subjected to one or more ion exposures at a first ion dose rate and subjected to one or more exposures at a second ion dose rate that is higher than the first ion dose rate. In some embodiments, an exposure may be one or more scans in which a plasma sheath modifier 312 is scanned with respect to a substrate containing the patterned photoresist relief features 114a along a direction 320. Because the plasma sheath modifier 312 may be a plate having an aperture 322 through which ions 310 are extracted, some embodiments of the plasma sheath modifier are referred to herein as an "extraction plate." The extraction plate may have one or more apertures that modify the shape of a plasma sheath as described above. In various embodiments, the substrate 112 may be scannable along direction 320 with respect to an aperture of an extraction plate. Accordingly, regardless of the width of aperture 322, an entire substrate or desired portion thereof, which may include many photoresist relief features 114a, may be exposed to ions 310 during a scan. In various embodiments, the plasma 306 may be continuous or a pulsed plasma, and a bias between substrate holder 304 and plasma 306 may be continuous or pulsed.

In accordance with some embodiments, a series of scans of an extraction plate are performed over a patterned photoresist relief feature using an argon plasma and an ion energy of about 750 eV. The scans may be performed as part of a multi-setpoint RF plasma (MSPRF) process, in which the power setpoint for the plasma may be varied. Thus, a first exposure may be one or more scans of an extraction plate over a patterned photoresist relief feature(s) in which the RF power is set at a first level, and a second exposure may be one or more scans of the extraction plate in which the RF power is set at a second level higher than the first level. In some embodiments, a first exposure that includes one or more scans is made at a relatively lower plasma power. The relatively lower plasma power results in a relatively lower ion dose rate of ions directed towards the patterned photoresist relief feature. At this lower ion dose rate, a decrease in both line LWR/LER and CD from initial values to respective second values may be observed after the exposure. Subsequently, one or more scans are made at a relatively higher plasma power, which produces a relatively higher ion dose rate. After the second set of scans, an increase in CD from the second value to a third value may be observed. In one set of examples, after performance of this multiple ion dose rate treatment, the LWR/EWR reduction was up to 50% while CD variation ranged from −2 nm to +5 nm depending on the ion dose rate in the second exposure.

FIGS. 4a-4d and 4e-4g depict side cross-sectional and top plan views of patterned photoresist relief features that provide details of an exemplary process for treating photoresist relief features. The process combines lower ion dose rate and higher ion dose rate exposures. In FIGS. 4a and 4e a set of photoresist relief features 402 having an initial width (CD) $W_1$ are subjected to an exposure to ions 404 over a first angular range using a first ion dose rate. The ions 404 may impact sidewalls 406, causing a reduction in sidewall roughness, such as LWR/LER. In various embodiments, ions 404 may be provided by a system, such as system 300, and the ion dose rate may be controlled by adjusting parameters including plasma power, pressure in a process chamber, gas flow in a process chamber. The ion dose rate may also depend on ion energy. In accordance with various embodiments, after the exposure to ions 404, the ion-exposed photoresist relief features 408 exhibit both a smaller CD ($W_2$) and lesser line roughness, as illustrated by sidewalls 410. In a subsequent exposure, depicted at FIGS. 4c and 4f, ions 412 are directed toward photoresist relief features 408 over a second angular range (which may be similar to or different from the first angular range) and at a second ion dose rate that is higher than the first ion dose rate used in the exposure to ions 404. After the exposure at the second, higher ion dose rate, the resultant photoresist relief features 414 exhibit a larger CD ($W_3$) than that of photoresist relief features 408. In various embodiments, the ion dose rate and total ion dose during exposure to ions 412 may be tailored to restore the CD to a desired value. For example, the ion dose rate may be tailored to restore the CD to the original CD $W_1$, or may be tailored to restore the CD to within a predetermined tolerance of the original CD $W_1$.

After exposure to ions 412, the sidewalls 416 of the resultant photoresist relief features 414 may remain smoother than sidewalls 406 before exposures to the ions 404 and ions 412.

As noted, in some embodiments, the combination of lower and higher ion dose rate exposures may be designed to provide a match between the initial and final CD, $W_1$ and $W_3$, respectively. Thus, the effect of the multiple ion exposure processing depicted in FIG. 4 may be to smoothen the photoresist sidewalls without effectively changing CD.

In other embodiments, the dose rate and dose of ions 412 may be designed to yield a final CD that is larger than the initial CD $W_3$. For example, after a lithographic process, the measured CD (corresponding to $W_1$) for photoresist relief features of interest may be smaller than the nominal or target CD for that process. Therefore, after an exposure to ions 404 to improve line roughness, it may be desirable to restore the CD of the photoresist features to the nominal value. Accordingly, the exposure to ions 412 may be arranged to yield a CD corresponding to $W_3$ that is greater than $W_1$ and reflects the target CD.

In still other embodiments, the order of exposure to ions 404 and 412 may be reversed, such that the high ion dose rate exposure occurs prior to the low ion dose rate exposure. In this manner, an initial photoresist relief feature CD $W_1$ may be increased to a value $W_4$ (not shown) before a second, lower ion dose rate exposure is applied. After the lower ion dose rate exposure, the line roughness may be reduced and the CD may be reduced from $W_4$ to $W_3$, which may be close to or the same as $W_1$. However, in cases in which photoresist relief features are closely spaced, it may be more convenient to perform the low ion dose rate exposure first, since neighboring photoresist relief features having a width $W_4$ greater than $W_1$ may crowd one another and obstruct portions of their sidewalls from receiving ion flux during a subsequent low ion dose rate exposure.

In various embodiments, as previously noted, the ion dose rate may be controlled by varying the plasma power of a system that directs ions over a range of angles toward patterned photoresist relief features. Referring again to FIG. 2a, in the case of an RF plasma, the plasma power may be varied by changing the signal amplitude sent from RF generator 330 to antenna 332. At higher plasma power levels, the ion density in the plasma may be higher, which may afford the ability to extract ions at a higher ion dose rate from the plasma 306.

FIG. 5a depicts an exemplary plasma power curve 502 in which the plasma power is varied between a level P1 over a first portion 504 of the curve and a level P2 over a second portion 506 of the plasma power curve 502. In various embodiments, the level P1 may correspond to a lower ion dose rate that may initially be applied to a substrate, while the level P2 corresponds to a higher ion dose rate that may be applied subsequent to the lower ion dose rate. Referring also to FIG. 3, the first power level P1 may be applied during the duration of three successive passes (scan1-scan3) of a substrate 112 along the direction 320 with respect to an extraction plate (e.g., plasma sheath modifier 312) that directs ions toward the photoresist relief features 114a. The second power level P2 may be applied during a further set of scans (scans 4,5). It will be appreciated that the total number and duration of the scans, as well as the plasma power levels P1 and P2 may be adjusted to tailor the desired smoothening and final CD of photoresist relief features 114a. As noted, the plasma power may be applied in a continuous fashion while exposing the substrate to ions, or may be applied in pulses.

FIG. 5b depicts another embodiment in which a series of high ion dose rate scans are alternated with a series of low ion dose rate scans. In this embodiment, this is accomplished by alternating plasma power levels between P1 and P2 during successive scans (scan1-scan6). Each scan may correspond to a single scan of a substrate with respect to an extraction plate. Curve 512 presents a plasma power curve that alternates between portions 514, where plasma power is maintained at P1, and portions 516, where plasma power is maintained at P2. A single power level may be applied for the duration of one scan, as illustrated. After scan1, the sidewall roughness of photoresist relief features may be incrementally improved, with a concomitant incremental reduction in CD. After scan2, the incremental loss in CD produced by scan1 may be partially or wholly restored (or increased beyond an initial value before scan1). The exposure processes during scans1 and 2 are repeated in the subsequent scans such that the photoresist relief feature line roughness is reduced in a series of steps (corresponding to the odd numbered scans) that alternate with a series of steps in which the CD may be incrementally restored by the relatively higher ion dose rate during those steps.

FIG. 5b also depicts exemplary photoresist measurements at various points during the processing of resist lines according to the plasma power curve 512. The initial line roughness and CD measurements before exposure are represented by $LWR_1$ and $CD_2$, respectively. After a first exposure cycle comprising one scan each at power levels P1 and P2, the LWR may be reduced to a value $LWR_2$. The CD may be the same as before exposure, that is, $CD_2$. After a second cycle, LWR may be reduced to a value $LWR_3$, while the CD may be again maintained at $CD_2$. After a third cycle, LWR may be reduced to a value $LWR_4$, while the CD may be again maintained at $CD_2$. Thus, the effect of applying the plasma power curve 512 in conjunction with a plasma sheath modifier to process photoresist relief features may be to reduce roughness from $LWR_1$ to $LWR_4$ without affecting CD. It is to be noted that photoresist sidewall smoothening, such as reductions in line roughness, may also occur during the scans scan2, scan4, and scan6.

Besides varying the plasma power of a continuous plasma, the ion dose rate may be controlled by applying power to the plasma in a pulsed fashion. A high plasma power setpoint may be set for each plasma pulse to produce a first ion dose rate of for only a fraction of plasma pulses, such as every 10 pulses to produce a second, lower ion does rate. In such cases the ion dose rate may be characterized by an average ion dose rate as detailed further below.

The use of pulsed plasmas may afford another degree of control on final photoresist relief feature line roughness and CD as described below. For example, plasma pulsing may afford flexibility in modifying the ion dose rate as needed by adjusting the recipe for plasma pulses of a baseline process. In one instance, a baseline process recipe that uses a 300 W RF plasma power setpoint applied for every pulse in a pulsed plasma may produce a target reduction in line roughness. A recipe that employs a 500 W RF plasma power setpoint applied at every pulse in a pulsed plasma may be found to increase CD by about 10 nm. For a first set of substrates, the combination of the 300 W plasma power and 500 W plasma power process recipes may therefore produce the desired line roughness and CD of photoresist relief features.

However, it may be determined that for another set of substrates the final CD of photoresist relief features after performing the 300 W and 500 W RF plasma power exposures is 5 nm too large. Accordingly, it may be desirable to alter the higher ion dose rate (500 W) process to reduce the photoresist swelling. In this case, in the second exposure, the high plasma power setpoint (500 W) may be applied every other pulse, while a lower plasma power setpoint (such as 300 W) is applied every other pulse, which may produce an ion dose rate intermediate between the baseline 300 W plasma power recipe and the uniform 500 W plasma power recipe. This intermediate ion dose rate may result in the desired increase in CD for the second set of substrates.

FIGS. 6a-6c depict alternate embodiments of pulsed plasma processing in which the average ion dose rate is varied between relatively lower and higher values. In FIG. 6a, curve 602 depicts a plasma power curve in which a series of lower power pulses 608 are applied during a first portion 604, followed by a series of higher power pulses 610 during a second portion 606. The power level when the plasma is on is P3 for lower power pulses 608 and P4 for higher power pulses 610.

In some embodiments, the pulses 608 and 610 may be applied for a pulse duration on the order of a hundred microseconds up to a few milliseconds. In various embodiments, portions 604 and/or 606 may extend for many milliseconds up to many seconds and may correspond to the duration of one or more scans, for example, as depicted in FIG. 5. Thus, during a single portion 604 or 606, many pulses may be applied, such as tens, hundreds or thousands of pulses. Accordingly, the ion dose rate during a single portion 604 or 606 may be characterized by an average ion dose rate for the duration of the portion. In particular, the ion dose rate may be represented by curve 640, in which the ion dose rate may be averaged over time to account for the "on" and "off" periods of a plasma. For example, the ion dose rate may be averaged over a pulse period equal to the sum of the duration of the on and off periods of a pulse. Thus, curve 640 represents the time average ion dose rate (flux) over one or more pulse periods.

As depicted in FIGS. 6b and 6c, the same average ion dose curve 640 may result from a different combination of pulses. In FIG. 6b, the first portion 604 of plasma power curve 612 corresponds to a low ion dose rate exposure as represented by portion 604 of FIG. 6a, where power is applied at level P3 for a series of lower power pulses 608. The second portion 616 corresponds to a higher ion dose rate exposure that is brought about by providing every other pulse 620 at a plasma power P5, which is higher than P4. The pulses 620 are interspersed with lower power pulses 618, which may correspond to the power level 3. The combination of alternating pulses at power levels P3 and P5 may result in the same average ion dose rate 640b as that of FIG. 6a. In FIG. 6c, the first portion 604 of plasma power curve 622 is as in FIG. 6a, where power is applied at power level P3 for a series of lower power pulses 608. The second portion 626 is brought about by providing every fourth pulse 630 at a power P6, which is higher than P4 and P5, while the other three lower power pulses 628 are provided at power level P3. The combination of providing every fourth pulse at power level P6 and the other three pulses at P3 may result in the same average ion dose rate 640b as that of FIGS. 6a and 6b.

In some embodiments, a relatively lower ion dose rate treatment may be combined with a higher backside cooling for a substrate, while a relatively higher ion dose rate is combined with a relatively lower backside cooling. In some embodiments, the substrate backside cooling and thereby the substrate temperature may be varied by controlling the type of fluid or flow rate of fluid in cooling lines 336. However, backside cooling control may be provided by other apparatus, such as a known Peltier cooler (not shown). By providing relatively less backside cooling and thereby producing a higher substrate temperature during a higher ion dose rate exposure, the CD swelling may be amplified, since greater swelling may occur at higher temperatures.

As noted previously, in some embodiments, a first angular range of ions in a lower ion dose rate exposure may be different from a second ion dose rate at a higher on dose rate.

The methods described herein, may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In summary, the present invention provides novel and inventive methods and systems for reducing line roughness in patterned features, such as photoresist relief features, while independently controlling the resulting CD of such features.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although the embodiments detailed above are described with respect to photoresist processing, other embodiments may involve processing of resists such as electron beam resists, x-ray resists, or nanoimprint lithography resists.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of treating a photoresist relief feature on a substrate having an initial line roughness and an initial critical dimension, the method comprising:
   directing ions toward the photoresist relief feature in a first exposure at a first angular range and at a first ion dose rate configured to reduce the initial line roughness to a second line roughness; and
   directing ions toward the photoresist relief feature in a second exposure at a second ion dose rate greater than the first ion dose rate, the second ion dose rate being configured to swell the photoresist relief feature.

2. The method of claim 1, wherein, after the first exposure, the initial critical dimension is reduced to a second critical dimension, and wherein after the second exposure the second critical dimension is increased to a third critical dimension.

3. The method of claim 1, wherein after the first and second exposures, the resist feature has a third line roughness about equal to the second line roughness.

4. The method of claim 1, wherein, after the first and second exposure, the resist feature has a third critical dimension about equal to the initial critical dimension.

5. The method of claim 1, wherein, after the first and second exposure, the resist feature has a third critical dimension within a predetermined tolerance limit of the initial critical dimension.

6. The method of claim 5, wherein the predetermined tolerance limit is +/−5 nanometers from the initial critical dimension.

7. The method of claim 1, further comprising providing ions during the second exposure over a second angular range, said second angular range being different from the first angular range.

8. The method of claim 1, further comprising:
   cooling the substrate having the photoresist relief feature to a first temperature during the first exposure; and
   cooling the substrate to a second temperature greater than the first temperature during the second exposure.

9. The method of claim 1, wherein the directing the ions in the first and second exposures comprises:
   generating a plasma having a plasma sheath and ions therein;
   providing an extraction plate defining an aperture that is operable to modify a shape of a boundary defined between the plasma and the plasma sheath; and
   providing a bias between the substrate containing the resist feature and the plasma configured to attract ions across the boundary having the modified shape toward the resist feature.

10. The method of claim 9, comprising:
    performing the first exposure at a first plasma power level; and
    performing the second exposure at a second, higher plasma power level.

11. The method of claim 9, comprising:
    performing one or more scans of the extraction plate with respect to the substrate containing the photoresist relief feature during the first exposure, the extraction plate configured to provide ions over an angular range; and
    performing one or more scans of the extraction plate with respect to the substrate during the second exposure.

12. The method of claim 9, comprising:
    providing a set of pulses of the plasma at a first power level during the first exposure; and
    providing a set of pulses of the plasma at a second power level during the second exposure, wherein an average plasma power over a duration of the second exposure is greater than an average plasma power over the duration of first exposure.

13. The method of claim 12, further comprising providing a third set of pulses during the second exposure, wherein the second and third set of pulses correspond to different plasma power levels.

14. A method of treating a photoresist relief feature on a substrate having an initial line edge roughness and an initial critical dimension, the method comprising:
    directing, in a first exposure, ions towards the photoresist relief feature at a first dose rate and a first angular spread until the photoresist relief feature exhibits a second line roughness less than the initial line roughness, the photoresist exhibiting a second critical dimension less than the initial critical dimension after the first exposure; and
    directing, in a second exposure, ions towards the photoresist relief feature at a second dose rate greater than the first dose rate until the photoresist relief feature swells to a third critical dimension greater than the second critical dimension.

15. The method of claim 14, wherein the resist feature has a third line roughness about equal to the second line roughness.

* * * * *